United States Patent
Lee et al.

(10) Patent No.: US 7,187,318 B1
(45) Date of Patent: *Mar. 6, 2007

(54) PIPELINE ADC USING MULTIPLYING DAC AND ANALOG DELAY CIRCUITS

(75) Inventors: Bumha Lee, Pleasanton, CA (US); Sing W. Chin, Alameda, CA (US); Bill C. Wong, Milpitas, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/198,970

(22) Filed: Aug. 8, 2005

(51) Int. Cl.
*H03M 1/38* (2006.01)
(52) U.S. Cl. .................. 341/161; 341/155; 341/122
(58) Field of Classification Search ............ 341/156, 341/118, 120, 155, 161, 172, 144, 150, 122; 702/126; 327/94, 91; 710/69; 706/36
See application file for complete search history.

(56) References Cited

U.S. PATENT DOCUMENTS

| | | | | |
|---|---|---|---|---|
| 5,635,937 A * | 6/1997 | Lim et al. | ............... | 341/161 |
| 5,677,692 A * | 10/1997 | Hasegawa | ............... | 341/161 |
| 6,337,651 B1 * | 1/2002 | Chiang | ............... | 341/161 |
| 6,486,807 B2 * | 11/2002 | Jonsson | ............... | 341/120 |
| 6,501,411 B2 * | 12/2002 | Soundarapandian et al. | ... | 341/161 |
| 6,515,606 B2 * | 2/2003 | Lyden | ............... | 341/143 |
| 6,710,735 B1 * | 3/2004 | Lin | ............... | 341/161 |
| 6,756,929 B1 * | 6/2004 | Ali | ............... | 341/161 |
| 6,801,151 B1 * | 10/2004 | Opris | ............... | 341/161 |
| 6,822,598 B2 * | 11/2004 | Kobayashi | ............... | 341/155 |
| 6,822,601 B1 * | 11/2004 | Liu et al. | ............... | 341/161 |
| 6,839,009 B1 * | 1/2005 | Ali | ............... | 341/118 |
| 6,861,969 B1 * | 3/2005 | Ali | ............... | 341/161 |
| 6,963,300 B1 * | 11/2005 | Lee | ............... | 341/172 |
| 7,002,504 B2 * | 2/2006 | McMahill | ............... | 341/161 |
| 7,002,506 B1 * | 2/2006 | Tadeparthy et al. | ........ | 341/161 |
| 7,009,548 B2 * | 3/2006 | Chiang et al. | ............ | 341/161 |

(Continued)

OTHER PUBLICATIONS

Yang et al., "A 3-V 340mW 14-b 75-Msample/s CMOS ADC With 85-dB SFDR at Nyquist Input," *IEEE*, Dec. 2001 (6 pgs.) no date.

(Continued)

*Primary Examiner*—Linh Nguyen
(74) *Attorney, Agent, or Firm*—Brett A. Hertzberg; Merchant & Gould PC (57) ABSTRACT

Each stage of a pipeline ADC includes an analog delay cell, a sub-stage ADC, and a multiplying digital-to-analog converter (MDAC). The MDAC includes a sample-and-hold amplifier (SHA) circuit, a summer, a gain stage, and a DAC. The MDAC is arranged in cooperation with the analog delay cell such that the effects of a long comparator decision time under high-speed conditions are minimized. The first SHA, half clock cycle delay cell with unity gain transfer function, samples the input signal during the first clock period, followed by a strobe of the sub-ADC. Substantially half of the clock period can be utilized for the comparison time of the sub-ADC using the described methods. Since decoding is completed before MDAC sampling the first SHA output so that the complete half clock cycle can be arranged for amplifier settling in order to achieve the maximum operating speed with a given amplifier bandwidth.

20 Claims, 9 Drawing Sheets

U.S. PATENT DOCUMENTS 7,084,792 B2 * 8/2006 Hsu .......................... 341/118
7,088,278 B2 * 8/2006 Kurose et al. .............. 341/155

OTHER PUBLICATIONS

Min et al., "A 69mW 10b 80MS/s Pipelined CMOS ADC," *IEEE*, Feb. 12, 2003 (8 pgs.).

Limotyrakis et al., "A 150MS/s 8b 71mW Time-Interleaved ADC in 0.18µm CMOS," *IEEE*, Feb. 17, 2004 (5 pgs.).

Stroeble et al., "An 80MHz 10b Pipeline ADC with Dynamic Range Doubling and Dynamic Reference Selection," *IEEE*, Feb. 18, 2004 (3 pgs.).

* cited by examiner

PIPELINE ADC USING MULTIPLYING DAC AND ANALOG DELAY CIRCUITS

FIELD OF THE INVENTION

The present disclosure generally relates to analog-to-digital converter circuits. More particularly, the present disclosure relates to an analog-to-digital converter (ADC) that includes an MDAC arranged to operate with analog delay.

BACKGROUND

An analog-to-digital converter (ADC) is a device that takes an analog data signal and converts it into a digital code, i.e. digitizes or quantizes the analog signal. An ADC is a key building block in mixed-mode integrated circuits (ICs). Once the analog signal is converted into the digital domain, complicated signal processing functions can be performed with easier handling and improved noise immunity. In some instances, power dissipation can be reduced since many ADCs are implemented in a deep submicron CMOS process.

ADCs may employ a wide variety of architectures, such as the integrating, successive-approximation, flash, and the delta-sigma architectures. Recently, the pipelined analog-to-digital converter (ADC) has become a popular ADC architecture for use in high-speed applications such as CCD imaging, ultrasound medical imaging, digital video, and communication technologies such as cable modems and fast Ethernet. Pipelined ADCs are typically chosen because of their high accuracy, high throughput rate, and low power consumption. Moreover, the pipelined architecture generally provides better performance for a given power and semiconductor die area than other ADC architectures.

Figure 1:
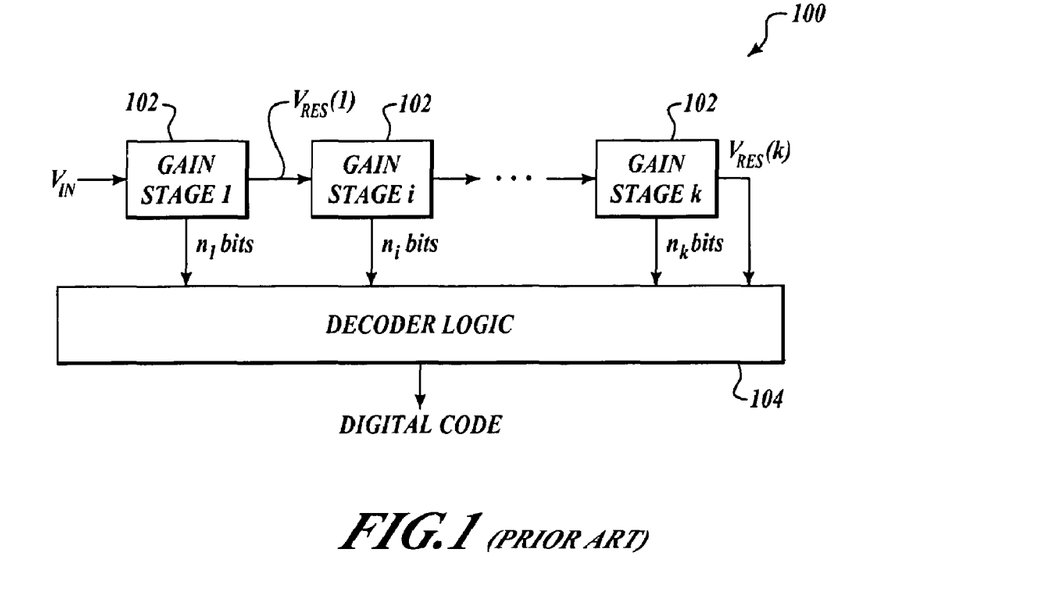
FIG. 1 illustrates a schematic block diagram of a conventional pipelined analog-to-digital converter (ADC).

An example of a conventional k-stage pipelined ADC (100) is shown in FIG. 1. As shown in the figure, the conventional k-stage pipelined ADC (100) includes an array of k gain stages (102) and a decoder logic circuit (104). Each of the gain stages (102) is connected in series to the previous gain stage (102). Each gain stage (102) is also connected to the decoder logic circuit (104).

In operation, an analog input voltage (Vin) is provided to the first gain stage (102). The first gain stage (102) samples the analog input voltage (Vin) and converts it to a first digital coefficient (n1). The first coefficient (n1) is processed by the decoder logic circuit (104) to provide the Most Significant Bit (MSB) of a digital data representation of the analog input voltage (Vin). The first gain stage (102) also converts the first digital coefficient (n1) back to an analog representation. The analog representation is subtracted from the sampled analog input voltage (Vin) and multiplied by a gain multiplier to provide a residue voltage. The residue voltage (Vres(1)) from the first gain stage (102) becomes the analog input voltage to the next gain stage (102) of the pipeline. That is, Vin (2)=Vres(1). The residue voltage (Vres(i)) continues through the pipeline of gain stages (102), providing another digital coefficient (ni) based on the digital representation of the input to that gain stage, as described above.

The overall digital representation of the analog voltage input (Vin) is obtained by concatenating the k digital coefficients (n1 through nk) from the array of k gain stages (102) through the decoder logic circuit (104). Digital error correction logic is typically used to improve the accuracy of conversion by providing overlap between the quantization ranges of adjacent gain stages (102) in the pipeline. An architecture that makes use of this correction to a 1-bit per stage pipelined ADC is a 1.5-bit per stage pipelined topology.

Figure 2:
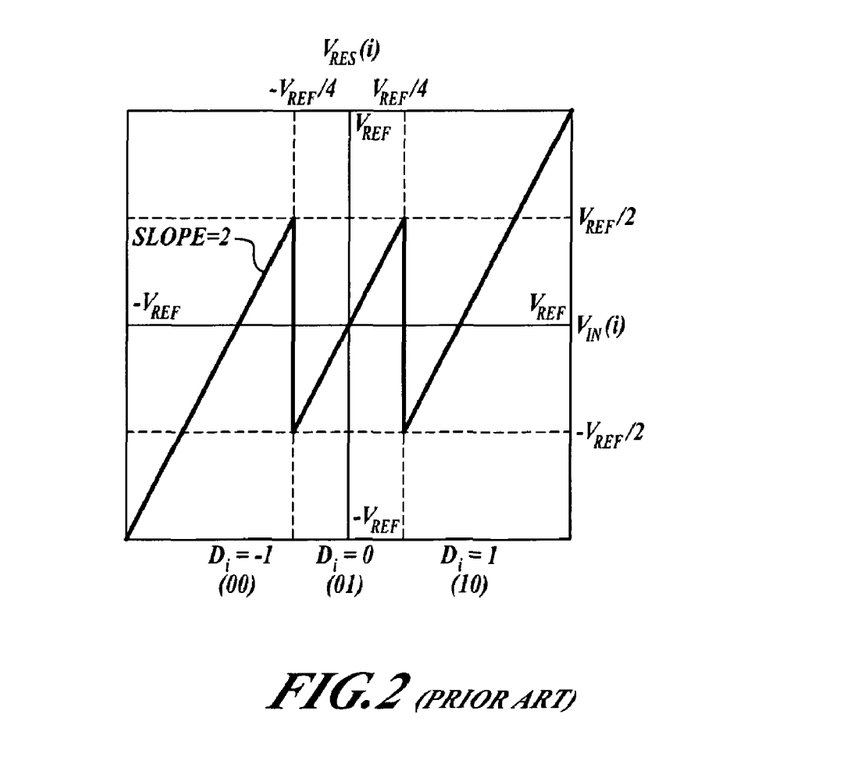
FIG. 2 illustrates a graph of an ideal transfer curve for the conventional 1.5-bit per stage pipelined analog-to-digital converter (ADC) of FIG. 1.

FIG. 2 is a graph illustrating ideal transfer characteristics of a 1.5-bit per stage conventional pipelined ADC such as illustrated in FIG. 1. In the 1.5-bit architecture, there are two thresholds or transition points in the transfer curve, resulting in three operating regions. Each stage of the 1.5-bit architecture effectively converts only one bit of information. The extra region (as compared to a 1-bit per stage topology) is used for redundancy. That is, the extra bit of information is combined with the digital outputs from subsequent gain stages (102) in the pipeline to generate another bit. The comparator offset from each stage does not introduce any error on the transfer curve at the final digital output by doing digital error correction as described above, when the offset is within its correction range.

As shown in FIG. 2, the input voltage (Vin) appears along the x-axis and illustrates that the resolvable input range of the ADC is given by: −Vref<Vin<+Vref. Two transition points appear along the x-axis. The first transition point occurs at Vin equal to −Vref/4 and the second transition point occurs at Vin equal to +Vref/4. The two transition points divide the operating range for the input voltage (Vin) into three operating regions, where two bits (00, 01, and 10) of the digital output of each stage characterize the entire range. Further, the slope of each curve reflects the gain multiplier employed in the gain stage (102) of FIG. 1.

Operationally, the gain stage (102) examines the input (Vin(i)) and determines whether the input is less than the first transition point, −Vref/4. If Vin(i) is less than the first transition point (−Vref/4) then the digital code output for the gain stage (102) is 00. Similarly, a digital output code of 01 is generated for Vin(i) between the first transition point, −Vref/4, and the second transition point (+Vref/4). If Vin(i) is greater than the second transition point, +Vref/4, the ideal transfer characteristic generates a digital output code of 10.

Moreover, the output residue voltage (Vres(i)) is generated by the following transfer function:

$$Vres(i) = 2^M \cdot Vin(i) - Di \cdot Vref \qquad (EQ\ 1)$$

where M is the number of effective bits that are being generated by stage i, $2^M$ represents the gain multiplier for the gain stage (102), and Di is a constant determined by the digital representation of the analog input voltage (Vin), having possible values of −1, 0, and 1. For the 1.5-bit per stage ADC, the number of effective bits (M) is one. The output residue voltage (Vres(i)) generated at the ith gain stage (102) becomes the analog input voltage (Vin (i+1)) to the next gain stage (102).

BRIEF DESCRIPTION OF THE DRAWINGS

Non-limiting and non-exhaustive embodiments are described with reference to the following drawings.

DETAILED DESCRIPTION

Various embodiments will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context clearly dictates otherwise. The meanings identified below are not intended to limit the terms, but merely provide illustrative examples for use of the terms. The meaning of "a," "an," and "the" may include reference to both the singular and the plural. The meaning of "in" may include "in" and "on." The term "connected" may mean a direct electrical, electromagnetic, mechanical, logical, or other connection between the items connected, without any electrical, mechanical, logical or other intermediary therebetween. The term "coupled" can mean a direct connection between items, an indirect connection through one or more intermediaries, or communication between items in a manner that may not constitute a connection. The term "circuit" can mean a single component or a plurality of components, active and/or passive, discrete or integrated, that are coupled together to provide a desired function. The term "signal" can mean at least one current, voltage, charge, data, or other such identifiable quantity General Remarks Briefly stated, the present disclosure generally relates to a system and method for a pipeline ADC. Each stage of the pipelined ADC includes an analog delay cell, a sub-stage ADC (sub-ADC), and a multiplying digital-to-analog converter (MDAC). The MDAC includes a sample-and-hold amplifier (SHA) circuit, a summer, a gain stage, and a DAC. The MDAC is arranged in cooperation with the analog delay cell such that the long comparator decision time is not limiting the operating speed of the ADC. The first SHA samples the input signal during the first clock period, followed by a strobe of the sub-ADC. The output of the first SHA is sampled by the second SHA, while the sub-ADC and decoder logic are deciding the representative digital output code, which is converted back into the analog signal by the DAC. Decoding is completed before the MDAC generates the residue voltage, which occurs during the amplification clock phase of the amplifier. Substantially half of the clock period can be utilized for the comparison time of the sub-ADC using the described methods.

Modern applications are demanding higher performance from analog-to-digital converter (ADC) circuits. The present disclosure contemplates increased bit resolution, high operating speed in the range of ultrasound imaging, high performance digital instrument system, and wireless communication applications. Requirements are especially high for undersampled systems where zero-intermediate frequency (non-IF) sampling or direct conversion is employed. New applications may require resolution on the order of 12 to 14-bits, with operating frequencies exceeding a hundred megasamples per second (MSPS) and input frequencies over one hundred megahertz (MHz).

The present disclosure contemplates improvements to a pipelined stage ADC circuit that includes the addition of an analog delay cell. The analog delay cell is arranged in a front end of the circuit to relax the propagation delay due to the combination of the comparator decision time and following decoding. The described multi-bit pipeline stage delivers improved SFDR and lower power dissipation.

Multi-bit per Stage MDAC

High-resolution per-stage MDAC architecture has higher SFDR, which is an important specification in the communication applications, due to the averaging effect on capacitor mismatch. For low power dissipation especially, two stage amplifiers should be used for high DC gain and wide output swing due to the smaller number of amplifiers for the entire ADC and also lower capacitive loading on each stage output.

A two-stage amplifier is preferable over a gain-boosted amplifier from the perspective of DC gain, which is strongly dependent on the impact ionization current in deep submicron process, and also has a wider output swing range. The first stage amplifier can have a relatively high DC gain (e.g., using gain-boosting) with a limited output swing to prevent the impact ionization current, while the second stage amplifier can have relatively low DC gain with a wide output range. The two-stage amplifier can be used in the switched capacitor circuit to operate as a MDAC. However, the stability of this two-stage amplifier is directly a function of the Miller compensation capacitor and the loading capacitance presented to the second stage amplifier, which can be a simple differential pair amplifier. Optimal phase margin can be achieved by just adjusting the ratio of the Miller compensation capacitor to the load capacitor.

Although additional comparators are required for this implementation, the power dissipation for the comparators is much smaller than that of the amplifier. Smaller feedback switch sizes reduce the output loading capacitance since the feedback capacitor size is smaller than that of low resolution per stage capacitor. Additional comparators will increase the capacitive load on the amplifier output node. However, placing an interpolating preamplifier in the comparator bank can reduce this effect. The feedback capacitor will be reduced in half with each additional bit of resolution in the MDAC with a given target signal-to-noise ratio (SNR).

Example Gain Stage for Comparative Evaluation

Figure 3A:
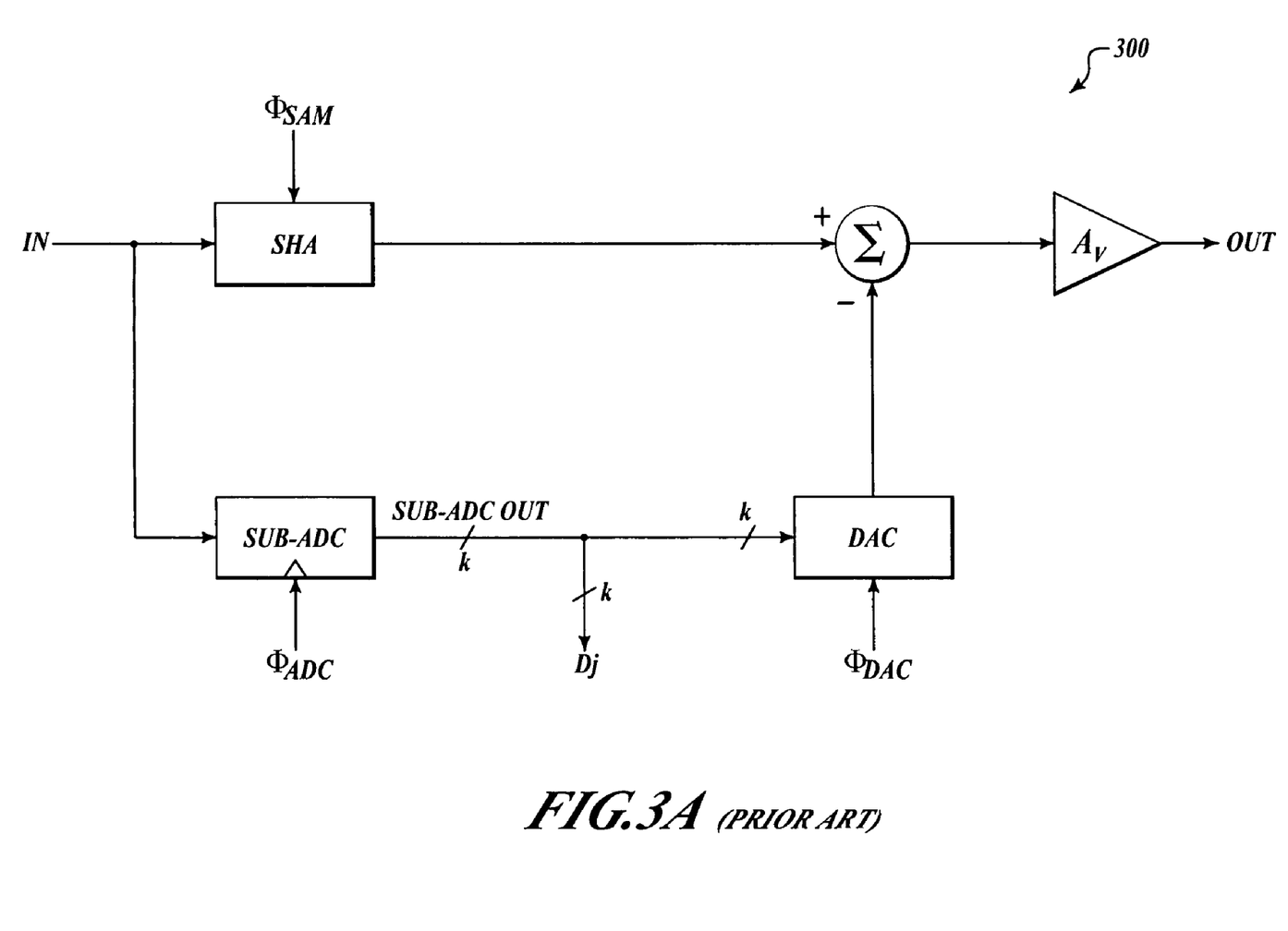
FIG. 3A illustrates a schematic diagram of a gain stage in a conventional pipelined ADC.

FIG. 3A illustrates a schematic diagram of a gain stage (300) in a conventional pipelined ADC. The gain stage includes a sample-and-hold amplifier (SHA), a sub-stage ADC (sub-ADC), a digital-to-analog converter (DAC), a summer ($\Sigma$), and a gain amplifier (Av). The input signal (IN) is split between SHA and sub-ADC. The output of sub-ADC is a multi-bit (k+1) data-signal (Dj). The data-signal (Dj) is fed into the decoder logic (e.g., see 104 from FIG. 1), and also fed into DAC. The output of DAC is subtracted from the output of SHA via the summer ($\Sigma$), where the difference is provided to the gain amplifier (Av) to generate the output signal (OUT) for a subsequent gain stage.

Figure 3B:
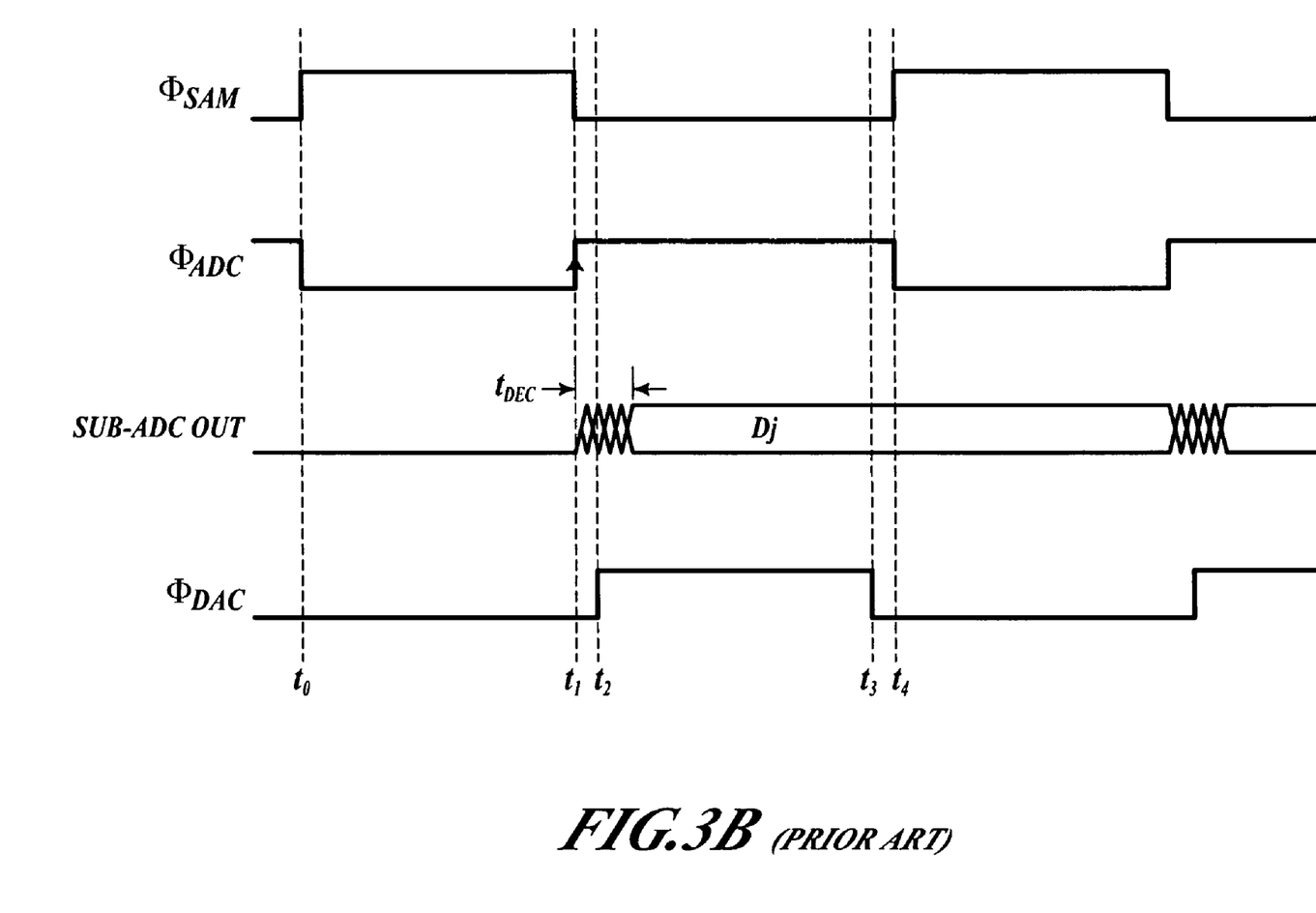
FIG. 3B illustrates timing signals for the gain stage of FIG. 3A.

FIG. 3B illustrates timing signals for the gain stage of FIG. 3A. SHA is responsive to signal $\Phi_{SAM}$, sub-ADC is responsive to the rising edge of signal $\Phi_{ADC}$. DAC is responsive to signal $\Phi_{DAC}$. The sampling time interval for SHA is from time $t_0$ through time $t_1$, where the input signal (IN) is sampled. From time $t_1$ through time $t_4$, the sampled input signal is held at the output of SHA as an input to the summer ($\Sigma$). Sub-ADC is operated to determine a conversion code for this stage of the converter (i.e., signal Dj) beginning at time $t_1$. Once the output of sub-ADC has reached a stable code after $t_{DEC}$ time period, which includes the comparator regeneration time and also decoding time followed by comparator. The DAC, the summer, and the gain amplifier (Av) are all simultaneously operating from time $t_2$ to time $t_3$. The decision time $t_{DEC}$ is the time period from the rising edge of signal $\Phi_{ADC}$ to the end of decoding.

The SHA, the DAC, the summer, and the gain stage can be implemented in a single stage switched-capacitor circuit, referred to as a multiplying digital-to-analog converter (MDAC). The dynamic performance and/or the achievable resolution of the pipelined ADC is limited by the imperfect capacitor matching in the capacitor arrays used for the multiplying conversion process in the MDAC. Other limiting factors include the thermal noise of the sampling capacitor network, the finite DC gain of the amplifier, amplifier noise, and noise introduced in the power supplies, noise introduced in the reference signals. The maximum operating speed of the pipelined ADC is limited by the bandwidth of amplifier for the switched capacitor circuit, the parasitic pole and zeros generated by the switched capacitor array, and the sub-stage ADC operating and decoding time (referred to as the "decision time").

Right after the sampling is done by SHA, the sub-ADC starts its operation. If the decision time ($t_{DEC}$) for sub-ADC is zero, the whole period of holding phase, high period of $\Phi_{DAC}$, can be utilized as the amplification phase of the switched capacitor circuit. The holding time (sometimes referred to as the amplification time) can be maximized for the amplifier settling, which is potentially the biggest bottleneck during the whole conversion operation. The sub-ADC cannot instantaneously evaluate the input signal and instead needs a finite amount of time to provide a decision from its comparing to finishing its decoding for the corresponding digital code. As shown in FIG. 3B, when comparator decision time ($t_{DEC}$) takes longer than the non-overlapping time (from time $t_1$ to time $t_2$), DAC output cannot reach its final value for a short time (time $t_2$ to end of period $t_{DEC}$) so that the maximum operation speed of ADC is reduced. Even the DAC can completely malfunction during the short time hence, the whole ADC may not work properly. For proper ADC operation, the starting time of DAC (time $t_2$) must be delayed with enough timing margin from the end of the comparator decision.

When the operation clock frequency is on the order of one-hundred (100) MHz, the amplification time can ideally be half of the clock time, or 5 nS. However, a small portion of the time needs to be allocated for overhead such as: generating non-overlapping clocks between sample and hold operating modes. This overhead time can be tightly controlled to be less than 0.5 nS in deep sub-micron process, however the decision time of a sub-ADC is longer than that and eventually limits the available amplification time for amplifier, ADC operating speed is simply reduced by more than 10% when $t_{DEC}$ is 1 nS, which is a normally achievable number with the highest speed comparator. When the operating clock frequency reaches higher, ADC operating speed is reduced even further in terms of percentage.

Improved Pipeline Operation with an Additional Analog Delay

The present disclosure considers all of the features and difficulties of the above-described pipeline converters and provides enhanced operation by a pipelined converter gain stage arrangement that includes an additional analog delay. The additional analog delay allows the comparator decision time ($t_{DEC}$) up to whole high period of $\Phi_{ADC}$ such that the summing and gain operation is not detrimentally effected.

Figure 4A:
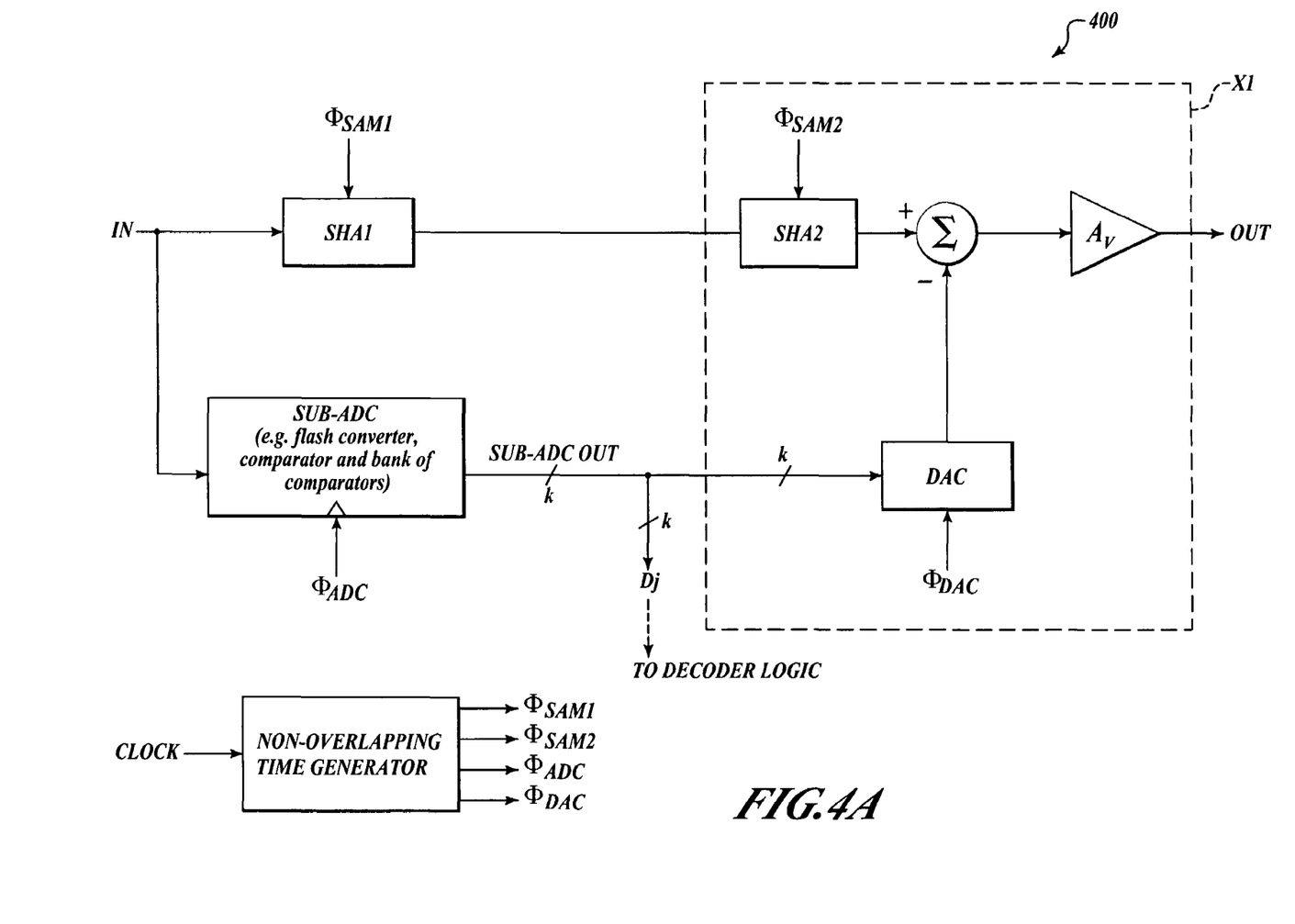
FIG. 4A illustrates a schematic diagram of an pipelined gain stage that is arranged in accordance with at least one aspect of the present disclosure.

FIG. 4A illustrates a schematic diagram of an pipelined gain stage (400) that is arranged in accordance with at least one aspect of the present disclosure. Gain stage 400 includes two sample-and-hold amplifier circuits (SHA1, SHA2), a sub-stage ADC (sub-ADC), a digital-to-analog converter (DAC), a summer ($\Sigma$), and a gain amplifier (Av). The input signal (IN) is split between SHA1 and SUB-ADC. The output of SHA1 is fed into SHA2. The output of sub-ADC is a multi-bit (k+1) data-signal (Dj). The data-signal (Dj) is fed into the decoder logic (e.g., see 104 from FIG. 1), and also fed into the DAC. The output of the DAC is subtracted from the output of SHA2 via the summer ($\Sigma$), where the difference is provided to the gain amplifier (Av) to generate the output signal (OUT) for a subsequent gain stage. The functions of the gain amplifier (Av), the summer ($\Sigma$), and the second sample-hold circuit (SHA2) can be combined into a single functional multiplying DAC circuit (MDAC) as is illustrated by X1 in FIG. 4A.

Figure 4B:
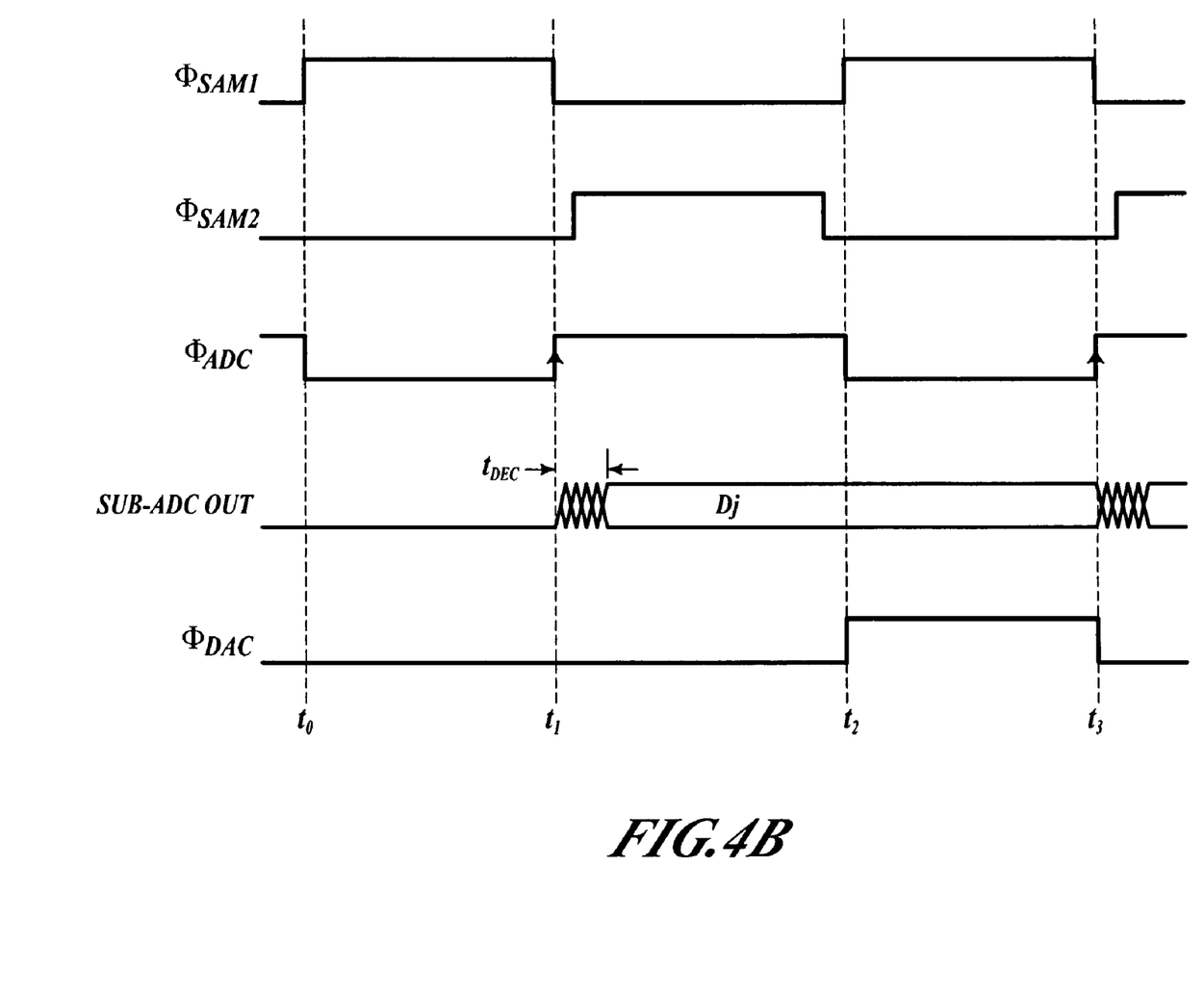
FIG. 4B illustrates timing signals for the gain stage of FIG. 4A.

FIG. 4B illustrates timing signals for the gain stage of FIG. 4A. SHA1 and SHA2 are responsive to signals $\Phi_{SAM1}$ and $\Phi_{SAM2}$, respectively. The sub-ADC is responsive to the rising edge of signal $\Phi_{ADC}$. The DAC is responsive to signal $\Phi_{DAC}$. The sampling time interval for SHA1 is from time $t_0$ through time $t_1$, where the input signal (IN) is sampled. For this example, input signal IN is held by SHA1 during the time interval from time $t_1$ to time $t_2$, which is when the output of SHA1 is sampled by SHA2 in response to the high period of signal $\Phi_{SAM2}$ with a half clock cycle analog domain latency to prevent ADC operating speed reduction due to the long comparator decision time. The sub-ADC is strobed at the rising edge of $\Phi_{ADC}$ such that the input signal (IN) is converted into a digital code word (Dj). The DAC generates corresponding to sub-ADC OUT (Dj) during the high period of $\Phi_{DAC}$, which is half clock cycle delayed from rising edge of $\Phi_{ADC}$. Half clock cycle delay input signal (IN) is subtracted by the DAC output and then it is multiplied by amplification factor ($A_V$) simultaneously during high period of $\Phi_{DAC}$. The timing control signals illustrated in FIG. 4B (e.g., signals $\Phi_{SAM1}$ and $\Phi_{SAM2}$ and $\Phi_{DAC}$) can be generated by a non-overlapping time control logic circuit (e.g., see FIG. 4A) as will be understood to those of skill in the art having read the present disclosure.

Time $t_2$ is also the start of the next conversion cycle of the pipelined converter. SHA1 samples a new input signal (IN). The sub-ADC is operated to determine a conversion code for this stage of the converter beginning at time $t_2$, and analog input signal is processed in pipeline as described above. One additional unit gain sample-hold amplifier (SHA1) is added in this disclosure as illustrated in FIG. 4A. Equivalently sub-ADC decision time is reduced to zero aided by the analog delay cell as long as decision time $t_{DEC}$ is shorter than half cycle of clock. SHA1 samples and stores the input signal during the first high period of the clock. Sub-ADC strobes right after sampling is completed with SHA1 responsive to rising edge of $\Phi_{ADC}$. The sub-ADC output is not used during the next holding period, which is high period of $\Phi_{SAM2}$. The entire half cycle period is available for the amplifier settling to achieve the maximum operating speed except for the clock non-overlapping. Substrate and/or power supply noise coupling from sub-ADC and following logic will be minimized since the noisy operation happens as early as possible. A lower speed comparator generating lower substrate noise can be used for the sub-ADC because substantially the entire half clock cycle can be dedicated to the comparator decision.

Figure 4C:
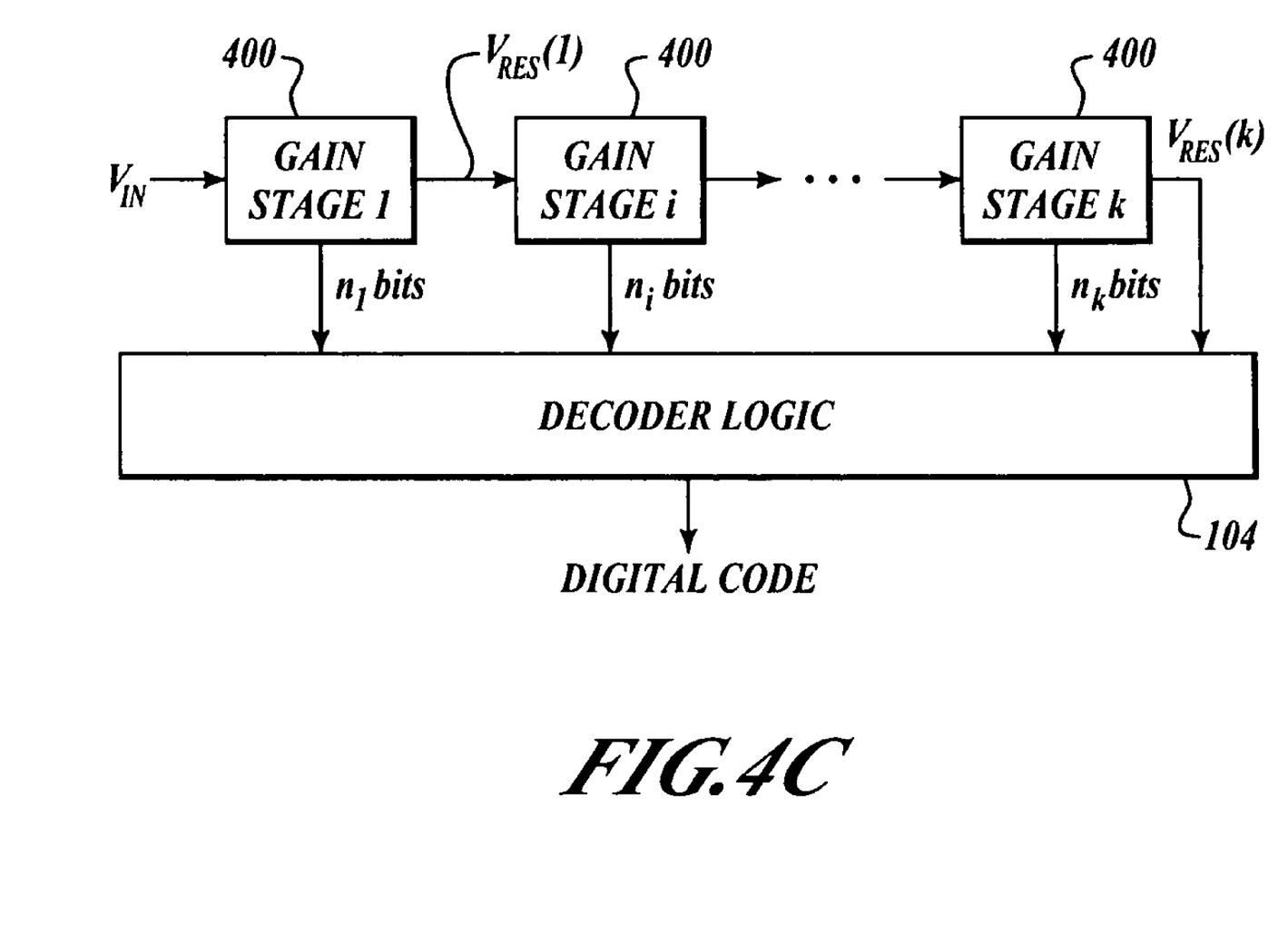
FIG. 4C illustrates a schematic diagram of a pipelined ADC using the example pipelined gain stage from FIG. 4A.

FIG. 4C illustrates a schematic diagram of a pipelined ADC using the example pipelined gain stage from FIG. 4A. As will be understood to those of skill in art having read the present disclosure, the pipelined ADC of FIG. 4C is substantially similar to that previously described with respect to FIG. 1 with each gain stage (102) from FIG. 1 being replaced with the gain stage (400) from FIG. 4A. Similar to that already described with respect to FIG. 1, the outputs from each of the gain stages (400) are coupled to a decoder logic circuit.

A requirement from the perspective of circuit implementation is that the analog delay cell is preferably a unity gain SHA circuit. The unity gain SHA circuit can be implemented with a flip-around type SHA as shown in FIGS. 5 and 6, which will be discussed below.

Example Analog Delay Circuits

Figure 5:
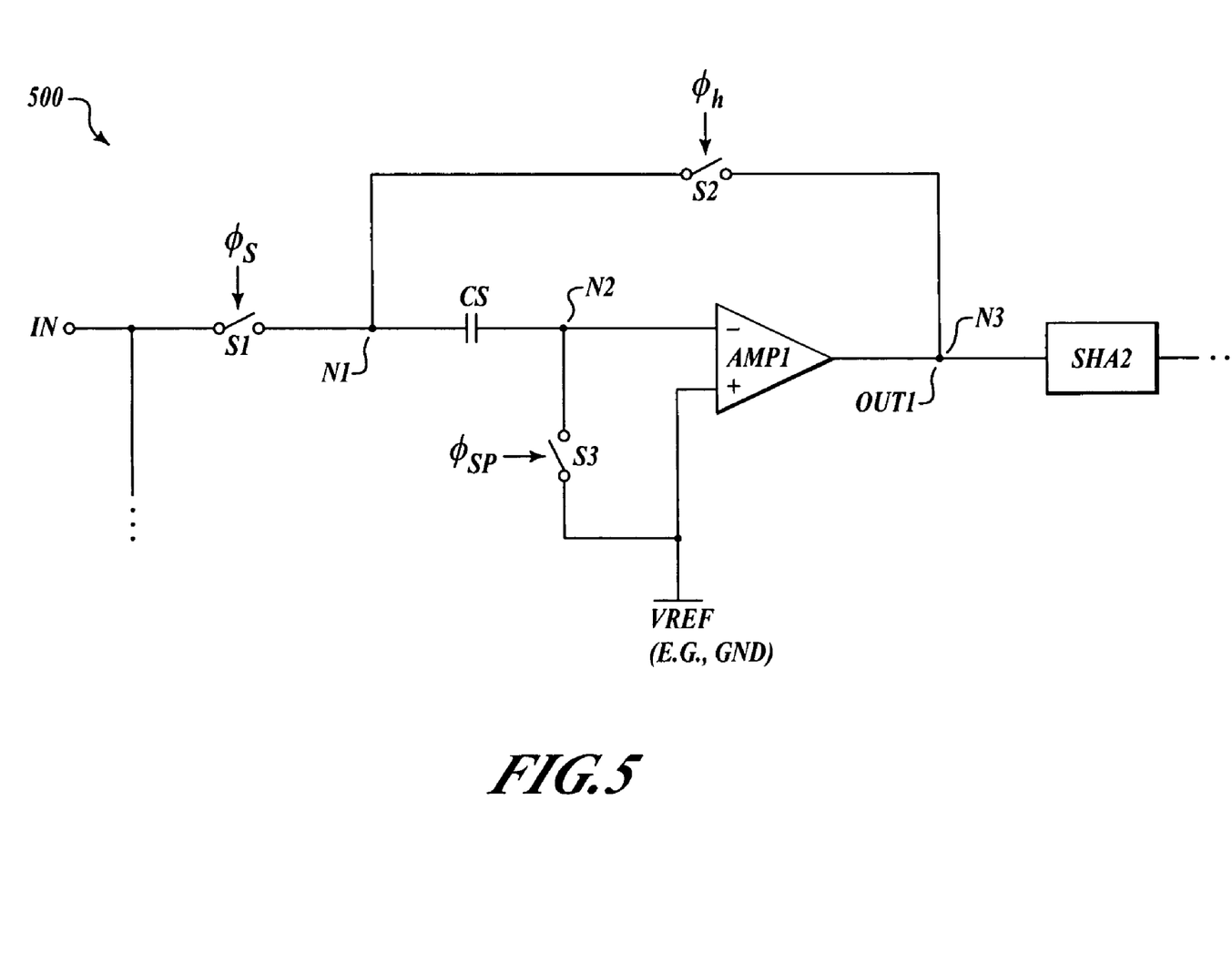
FIG. 5 illustrates a schematic diagram of an unity gain analog delay circuit that is arranged in accordance with at least one aspect of the present disclosure.
Figure 6:
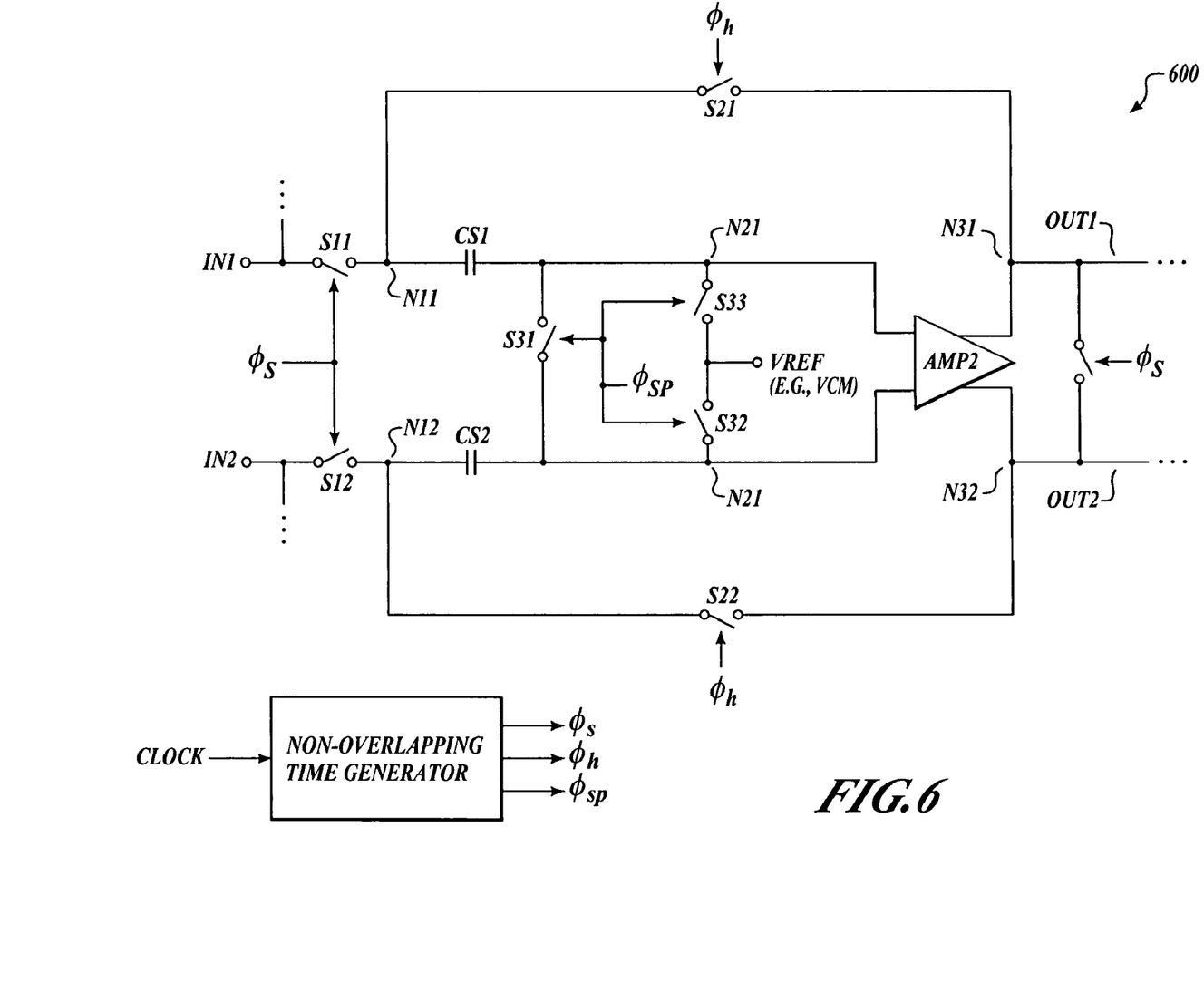
FIG. 6 illustrates a schematic diagram of another unity gain analog delay circuit that is arranged in accordance with at least one aspect of the present disclosure.

FIG. 5 illustrates a schematic diagram of an analog delay circuit (500) that is arranged in accordance with at least one aspect of the present disclosure. Analog delay circuit 500 includes three switching circuits ($S_1$–$S_3$), a capacitor circuit ($C_S$), and an amplifier circuit (AMP1). The analog delay circuit may be used in place of the first sample-and-hold circuit (SHA1) from FIG. 4A.

Switching circuit $S_1$ is arranged to selectively couple an input signal (IN) to node $N_1$ in response to signal $\Phi_S$. Capacitor circuit Cs is coupled between nodes $N_1$ and $N_2$. Node $N_2$ is coupled to an input (e.g., inverting input) of amplifier circuit AMP1. Another input (e.g., non-inverting input) of amplifier circuit AMP1 is coupled to a reference signal ($V_{REF}$). An output of amplifier circuit AMP1 is coupled to node $N_3$. Switching circuit $S_2$ is arranged to selectively couple node $N_1$ to node $N_3$ in response to signal $\Phi_h$. Switching circuit $S_3$ is arranged to selectively couple $V_{REF}$ to node $N_2$ in response to signal $\Phi_{SP}$. $V_{REF}$ may correspond to any appropriate reference level such as a common-mode voltage for the amplifier ($V_{CM}$).

During a sampling interval, switching circuits $S_1$ and $S_3$ are operated in a closed circuit position, and switching circuit $S_2$ is operated in an open circuit position. The capacitor circuit is coupled between the input signal (IN) and the reference voltage ($V_{REF}$) during the sampling interval such that capacitor circuit $C_S$ follows the input signal (IN). During a hold interval switching circuits $S_1$ and $S_3$ are operated in an open circuit position, and switching circuit $S_2$ is operated in a closed circuit position. Amplifier circuit AMP1 will drive the voltage at node $N_3$ to maintain the amplifier's input terminals at substantially the same voltages. The amplifier circuit will maintain the top plate voltage of capacitor CS as IN during the amplification phase of the amplifier. The output signal (OUT1) is taken as the voltage of node N3, which is coupled to SHA2 such as described in FIG. 4A.

The timing of the various signals ($\Phi_S$, $\Phi_{SP}$, and $\Phi_h$) can be optimized to minimize non-ideal circuit problems such as charge injection. Switching circuits $S_1$ and $S_3$ can either be operated at substantially the same time or in a non-overlapping fashion (e.g., $S_3$ is closed first, followed by $S_1$, or vice-versa). In one implementation, the timing between switching circuits $S_1$ and $S_3$ is slightly different so as to minimize charge injection. A make before break and/or break before make timing can also be used as may be necessary to minimize charge injection, noise, and other sources of error. Similarly, a make before break and/or break before make switching arrangement can be arranged between switching circuits $S_1$ (and/or $S_3$) and $S_2$.

FIG. 6 illustrates a schematic diagram of another analog delay circuit (600) that is arranged in accordance with at least one aspect of the present disclosure. Analog delay circuit 600 includes: seven switching circuits ($S_{11}$–$S_{12}$, $S_{21}$–$S_{22}$, and $S_{31}$–$S_{34}$), two capacitor circuits ($C_{S1}$, $C_{S2}$), and an amplifier circuit (AMP2).

Switching circuit $S_{11}$ is arranged to selectively couple a first input signal (IN1) to node $N_{11}$ in response to signal $\Phi_S$. Capacitor circuit $C_{S1}$ is coupled between nodes $N_{11}$ and $N_{21}$. Node $N_{21}$ is coupled to a first input (e.g., inverting input) of amplifier circuit AMP2. Switching circuit $S_{12}$ is arranged to selectively couple a second input signal (IN2) to node $N_{12}$ in response to signal $\Phi_S$. Capacitor circuit $C_{S2}$ is coupled between nodes $N_{12}$ and $N_{22}$. Node $N_{22}$ is coupled to a second input (e.g., non-inverting input) of amplifier circuit AMP2. Switching circuit $S_{31}$ is arranged to selectively couple node $N_{21}$ to node $N_{22}$ in response to signal $\Phi_{SP}$. Switching circuit $S_{32}$ is arranged to selectively couple a reference signal ($V_{REF}$) to node $N_{22}$ in response to signal $\Phi_{SP}$ and switching circuit $S_{33}$ is arranged to selectively couple a reference signal ($V_{REF}$) to node $N_{21}$ in response to signal $\Phi_{SP}$. A first output of amplifier circuit AMP2 is coupled to node $N_{31}$. A second output of amplifier circuit AMP2 is coupled to node $N_{32}$. Switching circuit $S_{21}$ is arranged to selectively couple node $N_{11}$ to node $N_{31}$ in response to signal $\Phi_h$. Switching circuit $S_{22}$ is arranged to selectively couple node $N_{12}$ to node $N_{32}$ in response to signal $\Phi_h$. Switching circuit $S_{34}$ is arranged to selectively tie $N_{31}$ and $N_{32}$ nodes together in response to signal $\Phi_S$, which is the input signal sampling phase.

The example circuit illustrated in FIG. 6 is a fully differential implementation that uses substantially the same theory of operation as that for FIG. 5. During a sampling interval, switching circuits $S_{11}$, $S_{12}$, and $S_{31}$–$S_{34}$ are operated in a closed circuit position, and switching circuits $S_{21}$ and $S_{22}$ are operated in an open circuit position. The capacitor circuits are each coupled between their respective input signals (IN1, IN2) and the reference voltage ($V_{REF}$) during the sampling interval such that capacitor circuits $C_{S1}$ and $C_{S2}$ follows the input signals (IN1, IN2). During a hold interval switching circuits $S_{11}$, $S_{12}$, and $S_{31}$–$S_{34}$ are operated in an open circuit position, and switching circuits $S_{21}$ and $S_{22}$ are operated in a closed circuit position. Amplifier circuit AMP2 will drive the voltage at nodes $N_{31}$ and $N_{32}$ to maintain the amplifier's input terminals at substantially the same voltages. The amplifier circuit will maintain the top plate voltage of capacitor $C_{S1}$ as IN1 and the top plate voltage of capacitor $C_{S1}$ as IN2 during the amplification phase. The output signals (OUT1, OUT2) are taken as the voltages at nodes N31 and N32, which are coupled to SHA2 such as described in FIG. 4A.

Figure 7:
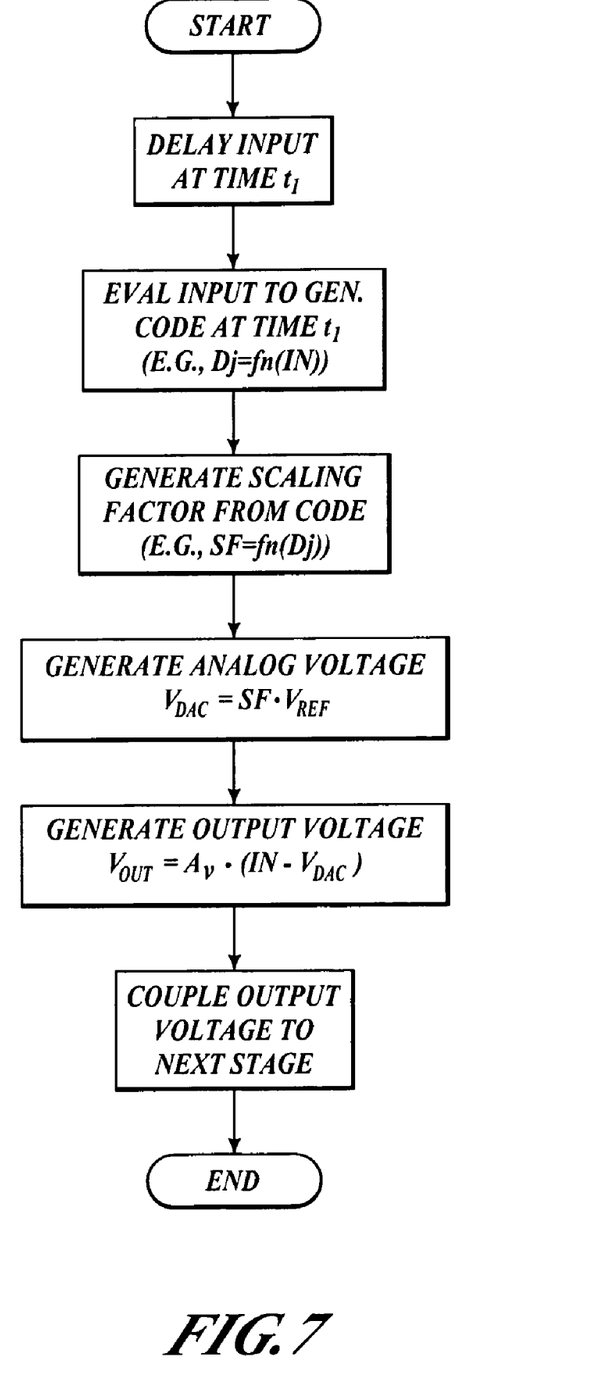
FIG. 7 illustrates an example procedural flow diagram for a pipelined gain stage that is arranged in accordance with at least one feature of the present disclosure.

FIG. 7 illustrates an procedural flow diagram for a pipelined gain stage that is arranged in accordance with at least one feature of the present disclosure. A delayed input (e.g., $IN_D(t_X)=IN(t_{X-1})$) is generated at time $t_1$ (e.g., by a SHA circuit). Also at time $t_1$, the input signal (e.g., IN) is evaluated to generate a digital code (e.g., Dj). The digital code (Dj) can be generated, for example, by a comparator circuit, a flash converter circuit, and/or an ADC circuit.

An analog voltage ($V_{DAC}$) is generated (e.g., by a DAC) in response to the resulting digital code (e.g., Dj) at time $t_2$. The analog voltage ($V_{DAC}$) is determined by a reference voltage ($V_{REF}$) multiplied times a scaling factor (sf) such that $V_{DAC}=sf*V_{REF}$. In one example, scaling factor sf corresponds to a digitally controlled numerical value such as $sf=1-(1/2)*D_K-(1/4)*D_{K-1}- \ldots -(1/2K)*D_1$. However, other weighted scaling factors are also contemplated including, but not limited to, an offset scaled value, a non-binary scaled value, a non-linearly scaled value, a logarithmically scaled value, to name a few. The reference voltage ($V_{REF}$) can correspond to a power supply voltage (e.g., VDD, VSS), a ground (GND), or some other voltage that can be generated by a reference generator circuit that may include another digitally controlled scaling coefficient.

Also at time $t_2$, a difference and multiplying operation is performed (e.g., by an MDAC) to determine the output voltage as: $V_{OUT}=Av*(V_{IN}-V_{DAC})$. The resulting output voltage is coupled to the next stage of the pipelined converter. Additionally, the digital codes (e.g., Dj) are combined together with the digital codes from other stages to decode the digital representation of the input signal (e.g., By a decoder logic block that evaluates all of the digital codes from the cascaded gain stages).

When the operating frequency of the pipelined ADC is greater than approximately one-hundred (100) MHz, the sub-ADC decision time should be minimized to spend longer time for the MDAC output settling. The sacrifice of the amplification time of the MDAC due to the sub-ADC decision time is completely resolved by adding one additional analog delay cell on the signal path as described here. A high resolution per stage MDAC architecture can be easily implemented to achieve high SFDR because sub-ADC strobing happens after the SHA output is completely settled. Substrate and/or power supply noise coupling from the sub-ADC and the following decoding circuits, such as MDAC, is minimized by strobing the sub-ADC as soon as possible for the next operation phase. A flip-around type SHA may be used for the unity-gain half clock-cycle delay cell to eliminate the requirement for passive component matching. Low speed, low power dissipation and low noise comparators can be used in the pipelined ADC within the scope of the present disclosure.

Although the invention has been described herein by way of exemplary embodiments, variations in the structures and methods described herein may be made without departing from the spirit and scope of the present disclosure. For example, the positioning of the various components may be varied. Individual components and arrangements of components may be substituted as known to the art. Circuit functions can be combined and/or separated into additional parts as may be desired for certain implementations. Since many embodiments of the invention can be made without departing from the spirit and scope of the invention, the invention is not limited except as by the appended claims.

What is claimed is:

1. An apparatus for converting an analog input signal to a digital output signal responsive to a clock signal, the apparatus comprising:

an analog delay circuit that is arranged to provide a delayed input signal at a first time in response to the analog input signal, wherein the delayed input signal is a sampled version of the analog input signal from the first time;

a sub-stage ADC circuit that is arranged to provide a digital code in response to an evaluation of the input signal during a time interval that substantially follows the first time; and an MDAC circuit that is arranged to provide an output signal in response to the delayed input signal and the digital code at a second time that is subsequent to the time interval, whereby a comparison time associated with the sub-stage ADC circuit is substantially complete prior to the second time.

2. The apparatus of claim 1, wherein the analog delay circuit comprises a sample-and-hold amplifier circuit that is operated on a first phase of a clock signal, wherein the first phase of the clock signal is substantially terminated at the first time.

3. The apparatus of claim 2, wherein the time interval that substantially follows the first time corresponds to a second phase of the clock signal.

4. The apparatus of claim 2, wherein the second time corresponds to a second cycle of the first phase of the clock signal such that the MDAC circuit is delayed by a clock period associated with the clock signal.

5. The apparatus of claim 1, wherein the sub-stage ADC circuit comprises either: a flash-type converter, a comparator, or a bank of comparators.

6. The apparatus of claim 1, wherein the MDAC circuit comprises: a sample-and-hold amplifier circuit, a summer circuit, a gain amplifier circuit, and a DAC circuit.

7. The apparatus of claim 6, wherein: the DAC circuit is arranged to generate a scaled voltage in response to the digital code, and the summer is arranged to determine a difference between the delayed input signal and the scaled voltage.

8. The apparatus of claim 6, wherein a switched-capacitor is arranged to provide the functions of the sample-and-hold amplifier circuit.

9. The apparatus of claim 1, wherein the analog delay circuit includes a first sample-and-hold amplifier that is operated on a first phase of a clock signal, wherein the first phase of the clock signal is substantially terminated at the first time, and wherein the MDAC circuit includes a second sample-and-hold amplifier circuit that is operated on a second phase of the clock signal, wherein the second phase substantially begins after the first time.

10. The apparatus of claim 1, the analog delay cell comprising either: a unity gain sample-and-hold amplifier circuit, or a flip-around type sample-and-hold amplifier circuit.

11. The apparatus of claim 1, the analog delay cell comprising:

a capacitor circuit that is coupled between a first node and a second node;

an amplifier circuit that is arranged to provide an output voltage to a third node in response to a difference between a reference voltage and a second node voltage, wherein the second node voltage is associated with the second node;

a first switching circuit that is arranged to selectively couple the analog input signal to the first node;

a second switching circuit that is arranged to selectively couple the first node to the third node; and a third switching circuit that is arranged to selectively couple the second node to the reference voltage.

12. The apparatus of claim 1, the analog delay cell further comprising:

a first capacitor circuit that is coupled between a first node and a second node;

a first switching circuit that is arranged to selectively couple a first input signal to the first node;

a second switching circuit that is arranged to selectively couple the first node to a third node;

a second capacitor circuit that is coupled between a fourth node and a fifth node;

a third switching circuit that is arranged to selectively couple a second input signal to the fourth node;

a fourth switching circuit that is arranged to selectively couple the fifth fourth node to a sixth node;

an amplifier circuit that has a first input that is coupled to the second node, a second input that is coupled to the fifth node, a first output that is coupled to the third node, and a second output that is coupled to the sixth node; and a fifth switching circuit that is arranged to selectively couple a reference voltage to the second and fifth nodes.

13. The apparatus of claim 1, further comprising: a non-overlapping time generator that is responsive to a clock signal, and arranged to adjust at least one of the first time, the second time, and the time interval.

14. The apparatus of claim 1, the analog delay cell further comprising:

a second analog delay circuit that is arranged to provide a second delayed input signal at a third time in response to the output signal, wherein the delayed input signal is a sampled version of the output signal from the third time;

a second sub-stage ADC circuit that is arranged to provide a second digital code in response to an evaluation of the output signal during a second time interval that substantially follows the third time; and a second MDAC circuit that is arranged to provide a second output signal in response to the second delayed input signal and the second digital code at a fourth time that is subsequent to the second time interval, whereby a comparison time associated with the sub-stage ADC circuit is substantially complete prior to the fourth time.

15. A pipelined ADC circuit, comprising:

a means for sampling an analog input signal at the end of a first time interval to provide a sampled input signal;

a means for evaluating the analog input signal at the end of the first time interval to generate a digital code;

a means for providing a scaling factor in response to the digital code during a second time interval, wherein the second time interval is subsequent to the first time interval;

a means for generating a scaled signal in response to the scaling factor and a reference signal during the second time interval a means sampling the sampled input signal to provide a delayed input signal during the second time interval;

a means for determining a difference between the delayed input signal and the scaled signal to provide a difference signal; and a means for gain scaling the difference signal to provide an output.

16. The apparatus of claim 15, further comprising a second gain stage that is arranged to receive the output and provide a second output in response thereto.

17. The apparatus of claim 15, further comprising a means for decoding digital codes from the means for evaluating.

18. A method for converting an analog input signal to a digital signal, comprising:

sampling the analog input signal at the end of a first time interval to provide a sampled input signal;

evaluating the analog input signal at the end of the first time interval to generate a digital code;

providing a scaled signal in response to the digital code during a second time interval that is subsequent to the first time interval;

sampling the sampled input signal to provide a delayed input signal during the second time interval;

determining a difference between the delayed input signal and the scaled signal to provide a difference signal; and gain scaling the difference signal to provide an output.

19. The method of claim 18, further comprising: coupling the output to a subsequent gain stage.

20. The method of claim 18, further comprising: decoding digital codes from multiple gain stages.

* * * * *

UNITED STATES PATENT AND TRADEMARK OFFICE
CERTIFICATE OF CORRECTION

PATENT NO. : 7,187,318 B1 Page 1 of 1
APPLICATION NO. : 11/198970
DATED : March 6, 2007
INVENTOR(S) : Bumha Lee et al.

It is certified that error appears in the above-identified patent and that said Letters Patent is hereby corrected as shown below:

Column 6, Line 66 "completed with SHAL" should read --completed with SHA1--

Column 11, Line 10 "the fifth fourth node" should read --the fourth node--

Signed and Sealed this

Thirty-first Day of July, 2007

JON W. DUDAS
*Director of the United States Patent and Trademark Office*